United States Patent [19]
Radloff et al.

[11] Patent Number: 5,544,006
[45] Date of Patent: Aug. 6, 1996

[54] COMPUTER CHASSIS HAVING FLEXIBLE CARD GUIDE FOR EXPANSION CARD INSERTION AND REMOVAL

[75] Inventors: Timothy M. Radloff; Erica J. Scholder, both of Austin, Tex.

[73] Assignee: Dell USA, L.P., Austin, Tex.

[21] Appl. No.: 374,450

[22] Filed: Jan. 18, 1995

[51] Int. Cl.[6] .................................. H05K 7/14; H05K 7/16
[52] U.S. Cl. .......................... 361/683; 361/684; 361/741; 361/756; 361/802; 174/138 G
[58] Field of Search ..................................... 361/683, 684, 361/685, 686, 796, 797, 798, 732, 740, 741, 747, 756, 759, 801, 802, 825, 807, 758, 730; 174/138 G; 439/160, 345, 346; 364/708.1; G06F 1/16

[56] References Cited

U.S. PATENT DOCUMENTS

| | | | |
|---|---|---|---|
| 3,644,868 | 2/1972 | Nevala | 174/138 G |
| 4,745,524 | 5/1988 | Patton, III | 361/683 |
| 5,038,308 | 8/1991 | Le et al. | 364/708.1 |
| 5,317,483 | 5/1994 | Swindler | 361/801 |
| 5,338,214 | 8/1994 | Steffes et al. | 361/683 |

*Primary Examiner*—Leo P. Picard
*Assistant Examiner*—Lynn D. Hendrickson
*Attorney, Agent, or Firm*—Michelle M. Turner; Mark P. Kahler; Henry N. Garrana

[57] ABSTRACT

The present invention provides, in a computer chassis containing a substantially planar removable expansion card therein, the computer chassis having an opening therein allowing access to the expansion card, a plane of the expansion card substantially parallel with a plane of the opening, a support structure for the expansion card and a method of supporting the expansion card. The support structure comprises: (1) a guide body movably attached to the computer chassis adapted to assume an engaged position and a retracted position and (2) guide projections on a surface of the guide body, a recess between the guide projections adapted to receive an edge of the expansion card when the guide body assumes the engaged position, the guide projections thereby supporting the expansion card as against a force normal to the plane of the expansion card, the guide body assuming the retracted position to allow the expansion card to be removed from the computer chassis in a direction normal to the plane of the expansion card and transverse to an orientation of the guide projections.

27 Claims, 8 Drawing Sheets

FIGURE 8 ns.com/page

COMPUTER CHASSIS HAVING FLEXIBLE CARD GUIDE FOR EXPANSION CARD INSERTION AND REMOVAL

TECHNICAL FIELD OF THE INVENTION

The present invention is directed, in general, to computer systems and, more specifically, to a card guide for supporting full length expansion cards in a computer system in which the expansion cards must be installed or removed in a direction that is lateral to the orientation of the card guides.

BACKGROUND OF THE INVENTION

In one conventional construction of desktop computer systems and, specifically, of desktop personal computers ("PCs"), the PC includes an outer housing having a bottom wall on top of which the computer motherboard or system planar is horizontally mounted. To install expansion and riser cards within the housing, it has previously been necessary to individually position each card over and separately connect each card to the motherboard using appropriate cable connectors (or other individual connection apparatus) with the expansion cards in a horizontally stacked array. In such systems, the riser card is perpendicular to the motherboard and a grounding connection for the expansion riser card is also installed. In another conventional desktop computer construction, the expansion cards are individually connected in vertical orientations to the motherboard without a separate riser card.

These installation techniques tend to be laborious and time-consuming, thereby undesirably increasing the overall fabrication cost associated with the computer. They also tend to adversely affect the serviceability and upgradeability of the computer since subsequent access to the motherboard requires that the expansion cards (and the riser card, if used) be individually disconnected and removed to gain access to the motherboard portion which they overlie. This disconnection of the expansion cards typically entails the laborious task of unscrewing each of the expansion cards from a housing structure, and disconnecting a variety of cables routed from the cards through the computer chassis to various connection points therein.

When servicing or upgrading of the motherboard is completed, the removed expansion cards must, of course, be individually reconnected to the motherboard. Typically, other internal computer components, such as cooling fans, are also individually connected to the motherboard and must be separately disconnected, to provide access to the motherboard portion which they overlie, and then be reinstalled when the servicing or upgrading of the motherboard is completed.

It can readily be seen from the foregoing that it would be highly advantageous, from serviceability, upgradeability, and manufacturability standpoints, to provide improved apparatus, and associated methods, for removably mounting operating components such as expansion cards (and, if incorporated in the computer, an associated riser card) on a computer motherboard.

Typical computer chassis designs allow the installation and removal of expansion cards in the same direction as the supporting card guides are oriented. One type of chassis design which allows this is where the expansion cards are plugged directly into the motherboard (or "planar") rather than a daughtercard extending perpendicularly from the planar ("riser card"). In this type of design, a card guide that is either a separate part or integral to the chassis can be oriented to allow unimpeded insertion of a full length expansion card. In another common chassis design, expansion cards plug into a riser card, which is fixed within the system, and are parallel to the planar once installed. There is an opening on one side of the chassis (once the cover is removed) that allows the expansion cards to be installed and removed. Since the riser card is fixed within the chassis, and is typically not removed in this type of design, the card guide can once again he oriented to allow unimpeded insertion of a full length card. The drawback to this design is that typically all the expansion cards must be removed individually before the user can remove the planar or access the area of the planar beneath the expansion cards.

Some manufacturers have worked to improve the serviceability of and the accessibility to the planar by implementing a card cage chassis design. In such designs, the riser card is mounted within a removable card cage. Expansion cards may then be installed when the card cage is either installed or removed from the system. The card guides are actually part of the card cage and therefore "travel" with the riser card and expansion cards. Once again there is no impediment when removing (with cards installed) from the system.

While the card cage approach to chassis design has worked well, it is not optimal in terms of cost. By associating the card guides with the card cage, this immediately constrains the use of the apparatus to a mechanical structure that is at least as long as a full length expansion card (about 13"). In the past, most of this length in the card cage was needed to support the mounting of cache cards and Video Equipment Standards Association local bus ("VL-Bus") riser cards. With on-board cache and Peripheral Component Interconnect ("PCI") risers becoming prevalent, the extra length of the card cage is no longer necessary for any other reason than to support full length expansion cards. Thus, the need arises to support full length expansion cards when the card guides are not associated with the card cage and do not "travel" with the riser card or expansion cards. For example, if the card guide is tied to the system, the card cage assembly can no longer be lifted out of the system because the card guides prevent motion of the expansion cards in that direction.

The accessibility problem is further complicated if the riser card is located toward the outside of the system and the expansion cards "point in" toward the center of the system. This totally eliminates the chassis design approach where the riser remains fixed within the system and the cards are removed from the side of the system.

Accordingly, what is needed in the art is a card guide capable of supporting full length expansion cards in a computer system in which the expansion cards must be installed or removed in a direction that is lateral to the orientation of the card guides.

SUMMARY OF THE INVENTION

To address the above-discussed deficiencies of the prior art, it is a primary object of the present invention to provide a movable card guide support structure that allows a card to be removed in a direction other than parallel to a plane of the card.

The card guide support structure is preferably implemented in a computer chassis containing a substantially planar removable expansion card therein. The computer chassis, preferably a PC chassis, has an opening that allows access to the expansion card; a plane of the expansion card substantially parallel with a plane of the opening; and the movable card guide support structure for the expansion card.

In a preferred embodiment, the movable card guide support structure comprises: (1) a guide body movably attached to the computer chassis adapted to assume an engaged position and a retracted position and (2) guide projections on a surface of the guide body including a recess between the guide projections that is adapted to receive an edge of the expansion card when the guide body assumes the engaged position. Preferably, the guide body is hingedly mounted to the computer chassis to allow the guide body to rotate between the engaged and retracted positions. More preferably, however, the support structure further comprises a spring for urging the guide body toward the engaged position.

The guide projections support the expansion card as against a force normal to the plane of the expansion card. The guide body can assume the retracted position to allow the expansion card to be removed from the computer chassis in a direction normal to the plane of the expansion card and transverse to an orientation of the guide projections. Preferably, the guide body is movably attached to a wall of the computer chassis opposite the opening. In a preferred embodiment, the guide body is elongated and provided with stiffening ribs substantially to prevent the guide body from flexing.

In a preferred embodiment of the present invention, the computer chassis further comprises a chassis cover adapted to cover the opening and thereby enclose the expansion card within the computer chassis. The chassis cover preferably includes a stop for preventing the guide body from assuming the retracted position when the chassis cover covers the opening. Additionally, the computer chassis may contain an expansion card cage that provides a framework for supporting the expansion card. The card cage preferably includes a riser card having a plane that is perpendicular to the plane of the expansion card. As the expansion card is removed from the chassis, the riser card, preferably, decouples from a motherboard within the computer chassis.

In another aspect of the present invention, one of the guide projections has a slanted surface that is adapted to urge the guide body toward the retracted position when the expansion card bears against the slanted surface.

In a preferred embodiment of the present invention, the support structure further comprises a plurality of guide projection-pairs. The plurality of guide projection pairs are adapted to support a plurality of parallel expansion cards within the computer chassis.

In another aspect of the present invention, there is provided a personal computer chassis, comprising a main chassis having a base wall and front, rear and opposing side walls joined to the base wall and a top open portion. Positioned with the chassis is an expansion card cage that is removably secured to one of the opposing side walls adjacent the rear wall. The expansion card cage has a framework that is configured to receive a riser card therein. The riser card has a card edge connector configured to be removably received in a motherboard riser connector to thereby electrically couple the riser card to a motherboard positioned with the main chassis. The riser card further has an expansion card connection socket for removably receiving therein an expansion card to thereby electrically couple the expansion card to the motherboard. The expansion card is substantially parallel with a plane of the top open portion.

Also positioned within the main chassis is a card guide structure pivotally mounted to the base wall and biased, preferably by a spring, between an engaged position and a retracted position.

The card guide structure has card guide projections on a surface of the card guide structure. The card guide projections have a recesses formed therebetween that are adapted to receive an edge of the expansion card when the card guide structure is in the engaged position. The card guide projections support the expansion card as against a force normal to the plane of the expansion card and is movable to the retracted position to allow the expansion card to be removed from the computer chassis in a direction normal to the plane of the expansion card and transverse to an orientation of the card guide projections. If so desired, the card guide structure may have a plurality of guide projection-pairs adapted to support a plurality of parallel expansion cards within the computer chassis.

In another aspect of the embodiment just described, the computer chassis further comprises a chassis cover adapted to cover the top open portion and thereby enclose the expansion card within the computer chassis. The chassis cover includes a stop thereon for preventing the guide body from moving to the retracted position when the chassis cover covers the top open portion. Preferably, the card guide projections have a slanted surface thereon adapted to urge the card guide structure toward the retracted position when the expansion card bears against the slanted surface.

In yet another aspect of the embodiment just described, the card guide structure is movably attached to the base wall of the computer chassis and may be elongated with stiffening ribs that substantially prevent the card guide structure from flexing.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the aft should also realize that such equivalent constructions do not depart from the spirit and scope of the invention in its broadest form.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
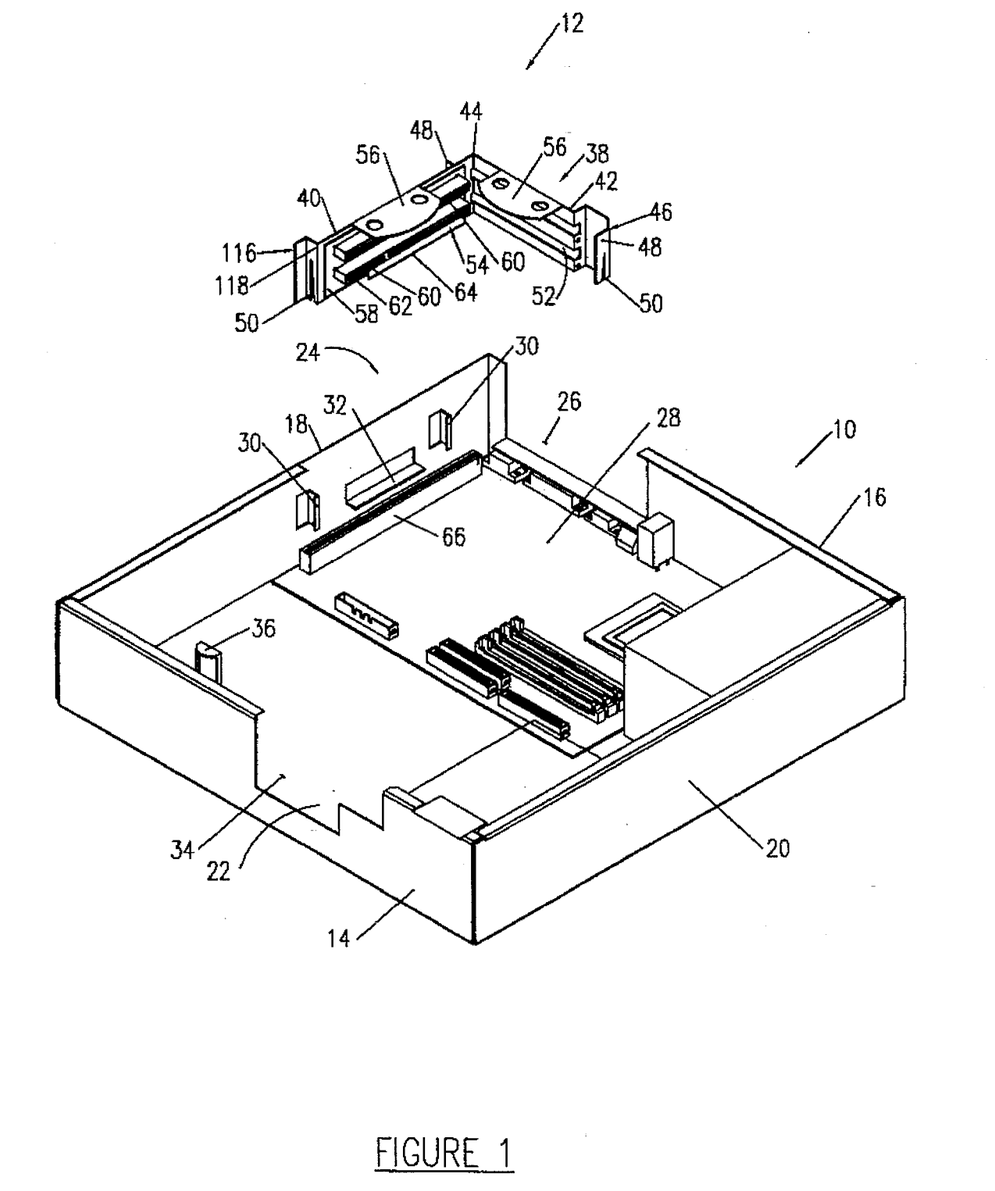
FIG. 1 illustrates a right frontside isometric view of a main chassis of a PC having an unpopulated expansion card cage exploded therefrom for clarity and featuring the guide body of the present invention.

Referring initially to FIG. 1, in a preferred embodiment thereof, there is illustrated a main chassis 10 of a PC having an unpopulated expansion card cage 12 exploded therefrom. The main chassis 10 has a generally rectangular shape with a front wall 14, a rear wall 16, opposing side walls 18,20 a base wall 22 and a top open portion 24 for allowing access to the interior of the main chassis 10. A main chassis cover member (FIG. 7) is adapted to removably cover the top open portion 24. The rear wall 16 has a generally rectangular slot 26 formed therein adjacent the expansion card cage 12 for receiving the expansion card cage 12 into the interior of the main chassis 10. Positioned within the main chassis 10 adjacent the base wall 22 and planar with the top open portion 24 is a motherboard 28 having electrical components positioned thereon. The side wall 18, which is adjacent the expansion card cage 12 includes mounting support fins 30 and a expansion card cage support structure 32 for mounting and supporting the expansion card cage 12. The front wall 14 also preferably has an access slot 34 formed therein to provide frontal access to electronic components, such as floppy disk drives, hard disk drive, CD ROM drives, power switches and indicator lights. Also positioned within the main chassis 10 is a card guide structure 36 of the present invention, which is discussed in more detail below.

The expansion card cage 12 is removable from the main chassis 10 and has a framework 38 that is preferably comprised of a first frame member 40 and a second frame member 42. The frame members 40 and 42 are joined transversely to form an outer corner 44 of the expansion card cage 12. It should be understood that frame members 40 and 42 may be made into a single frame member. Formed on at the outer corner 44 and on the outer ends 46 of the first and second frame members 40 and 42 are mounting fins 48. The mounting fins 48 each have a mounting slot 50, preferably "V" shaped, formed therein for engaging the mounting support fins 30 and mounting the expansion card cage 12 to the side wall 18 of the main chassis 10. The mounting fin 48 positioned at the outer corner 44 also has a mounting slot 50 formed therein, which is not seen in this view but is clearly illustrated in FIG. 2.

The first and second frame members 40 and 42 also include horizontally extending, rectangular securing slots 52 for holding and partially supporting expansion cards in a manner to be hereinafter described. Formed on the top edge of the first and second frame members 40,42 and projecting into the interior of the main chassis 10 are cover support members 56 that are designed to give added support to the first and second frame members 40,42 and offer added protection to the expansion cards when weight is exerted against the main chassis cover member (not shown).

As illustrated in FIG. 1, the first frame member 40 preferably supports a riser card 54. The riser card 54 has a horizontally elongated rectangular body portion 58 from which a vertically spaced series of horizontally elongated expansion card connection sockets 60 project outwardly into the interior portion of the main chassis 10. Projecting downwardly from the lower side edge 62 of the riser card body portion 58 is a card edge fingers 64 that is configured to be removably received in a motherboard riser connector 66 to electrically couple the riser card 54 to the motherboard 28.

Figure 2:
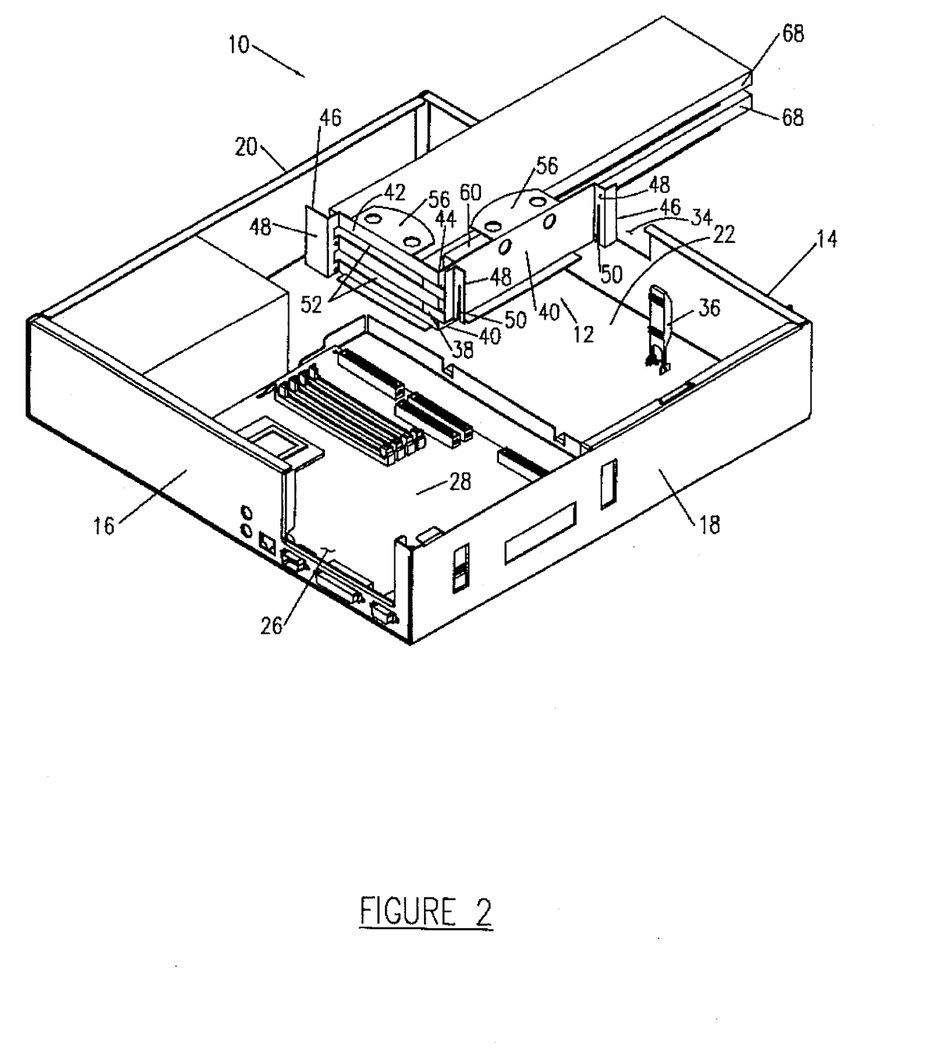
FIG. 2 illustrates a left rearside isometric view of the main chassis of FIG. 1 with a populated expansion card cage exploded therefrom for clarity and featuring the guide body of FIG. 1.

Turning briefly now to FIG. 2, illustrated is the main chassis 10 of FIG. 1 with the expansion card cage 12 exploded therefrom for clarity having expansion cards 68 retained therein. As previously mentioned above, the mounting fin 48, which is located adjacent the outer corner 44 of the expansion card cage 12 also has formed therein a mounting slot 50 for engaging the mounting support fins 30 (FIG. 1) to thereby hold the expansion card cage 12 in position within the interior of the main chassis 10. As shown, the expansion card cage 12 and thus, the riser card 54 are preferably positioned toward the outside of the main chassis 10 adjacent the side wall 18. The expansion cards 68 extend forwardly toward the front portion of the main chassis 10 where they engage and are supported by the card guide structure 36.

This unique combination and cooperation of components gives the system several advantages. First, there is a significant advantage in cooling the system because airflow is unimpeded by the riser card 54, unlike some prior art devices. Second, routing the electrical traces on the motherboard 28 is easier because the motherboard riser connector 66 does not split the motherboard 28 in half. Third, there is an improvement in electromagnetic interference ("EMI") containment because side wall 18 of the main chassis 10 does not need to be left partially open across it entire width to allow for expansion card 68 installation and removal. Fourth, the expansion card cage 12 and the riser card 54 can easily be removed from the main chassis 10 in a manner perpendicular to the plane of the top open portion 24.

Figure 3:
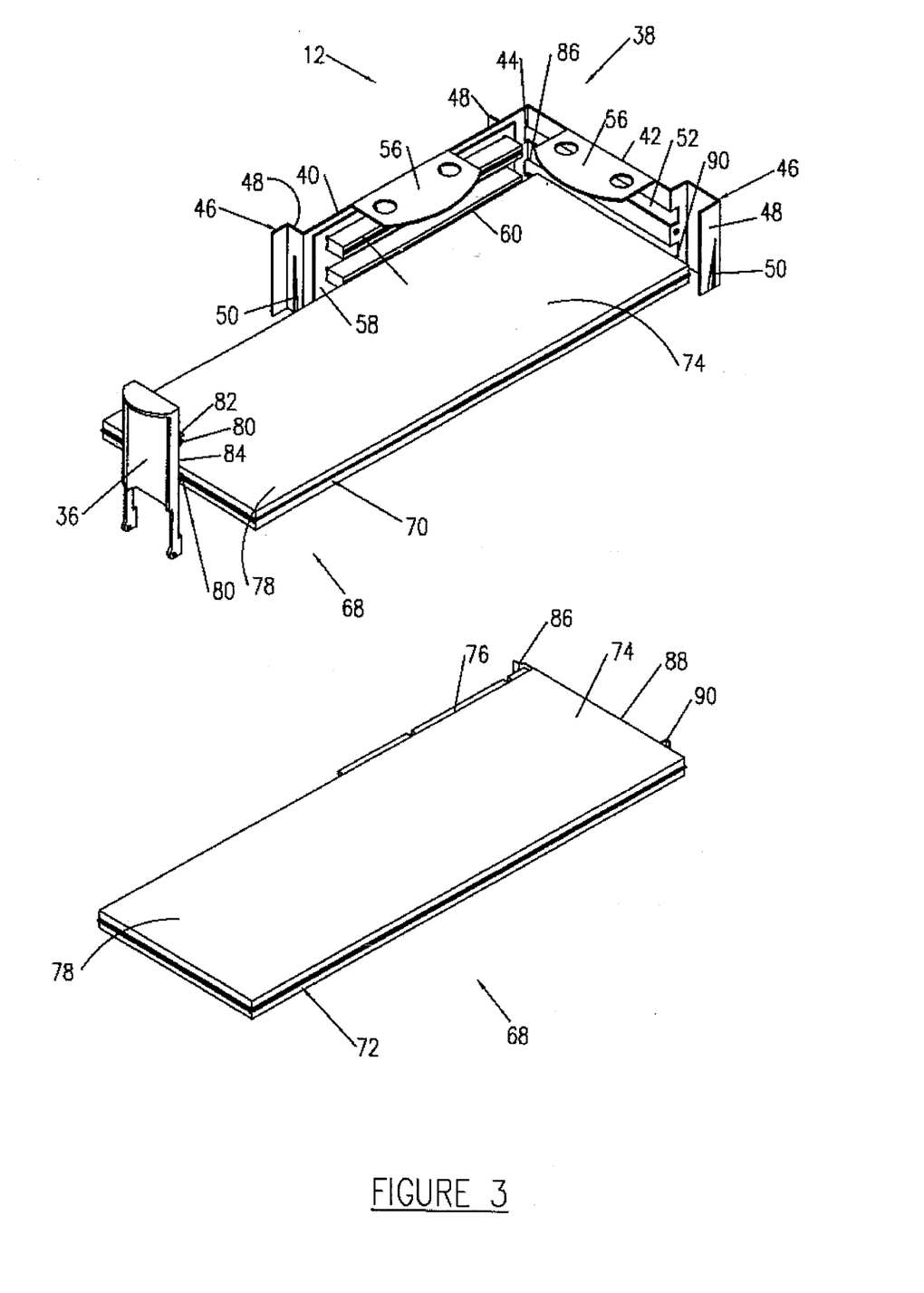
FIG. 3 illustrates a right frontside isometric view of the expansion card cage of FIG. 1 with a first expansion card inserted therein and a second expansion card exploded therefrom for clarity and the guide body of FIG. 1 illustrated in isolation from the main chassis of FIG. 1.
Figure 4:
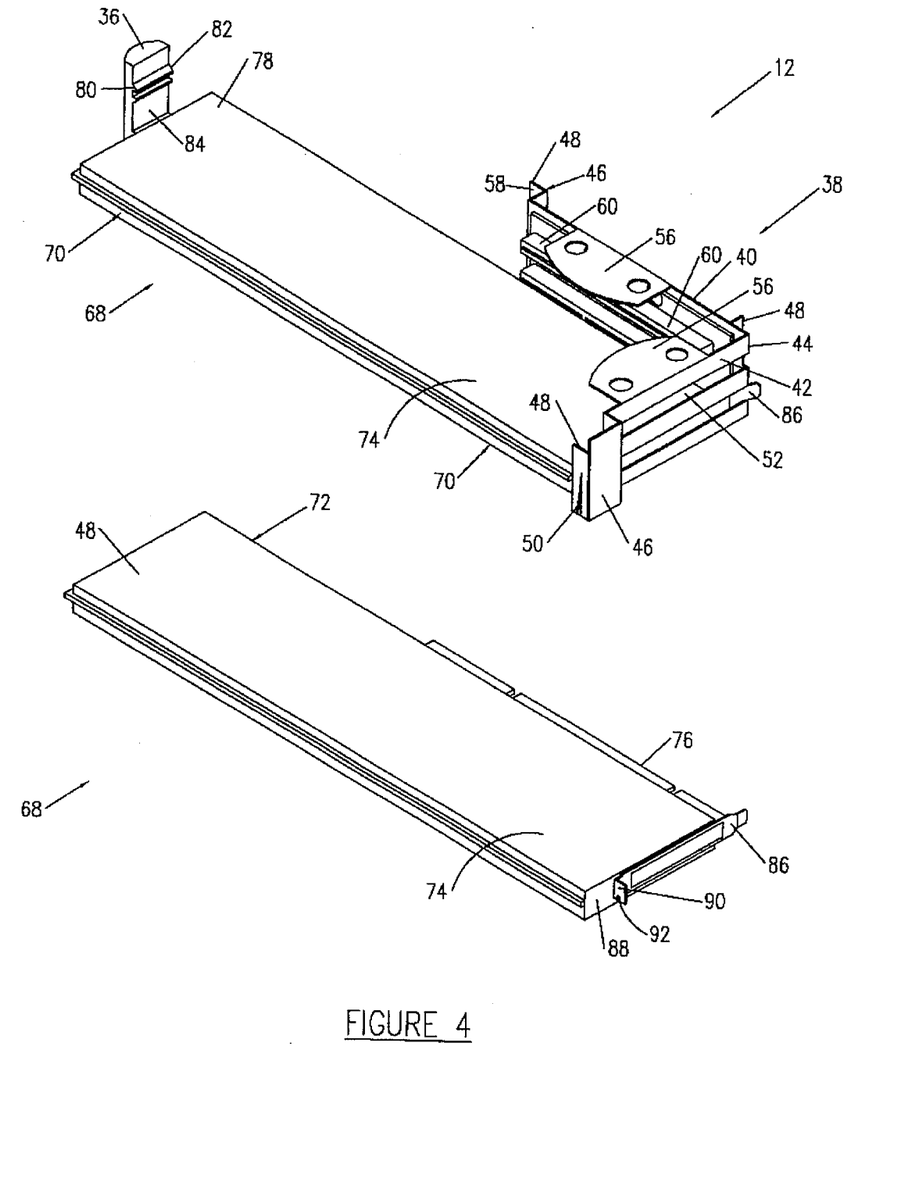
FIG. 4 illustrates a right rearside isometric view of the expansion card cage and first and second expansion cards of FIG. 3.

Turning now to FIGS. 3 and 4, illustrated in FIG. 3 is a right frontside isometric view of the expansion card cage 12 of FIG. 1 with a first expansion card 70 inserted therein and received by the card guide structure 36, and a second expansion card 72 exploded therefrom. The expansion card cage 12 is exploded, in isolation, from the from the main chassis 10 of FIG. 1 for clarity. Illustrated in FIG. 4 is a right rearside isometric view of the expansion card cage 12 with the first expansion card 70 inserted therein and received by the card guide structure 36, and the second expansion card 72 of FIG. 3 exploded therefrom. The first and second expansion cards 70,72 are horizontally elongated, rectangular planar members having first end portions 74 with riser card edge fingers 76 projecting therefrom and registered to be received by the expansion card connection sockets 60 on the riser. The length of the expansion cards 70,72 is sufficient such that an edge of the second end portion 78 of the expansion card 68 is received by a recess 80 formed between card guide structure projections 82 that project outwardly from and transverse to an inner, planar face 84 of the card guide structure 36. The card guide structure projections support the expansion cards 68 against a force normal to the plane of the expansion card 68.

The first end portions 74 are frictionally retained in the card connection sockets 60 and are also supported and retained in the expansion card cage 12 by a metal fin 86 that is cooperatively received by the securing slots 52 formed in the first and second frame members 40,42. The metal fin 86 extends transversely along an end edge 88 portion of each expansion card 68 and is adapted to be received by the securing slots 52. Formed in its top side edge, the metal fin 86 has an outwardly bent rear end portion 90 that has an arcuate notch 92 formed therein adapted to receive a screw member therethrough to secure the expansion card 68 to the expansion card cage 12.

Figure 5:
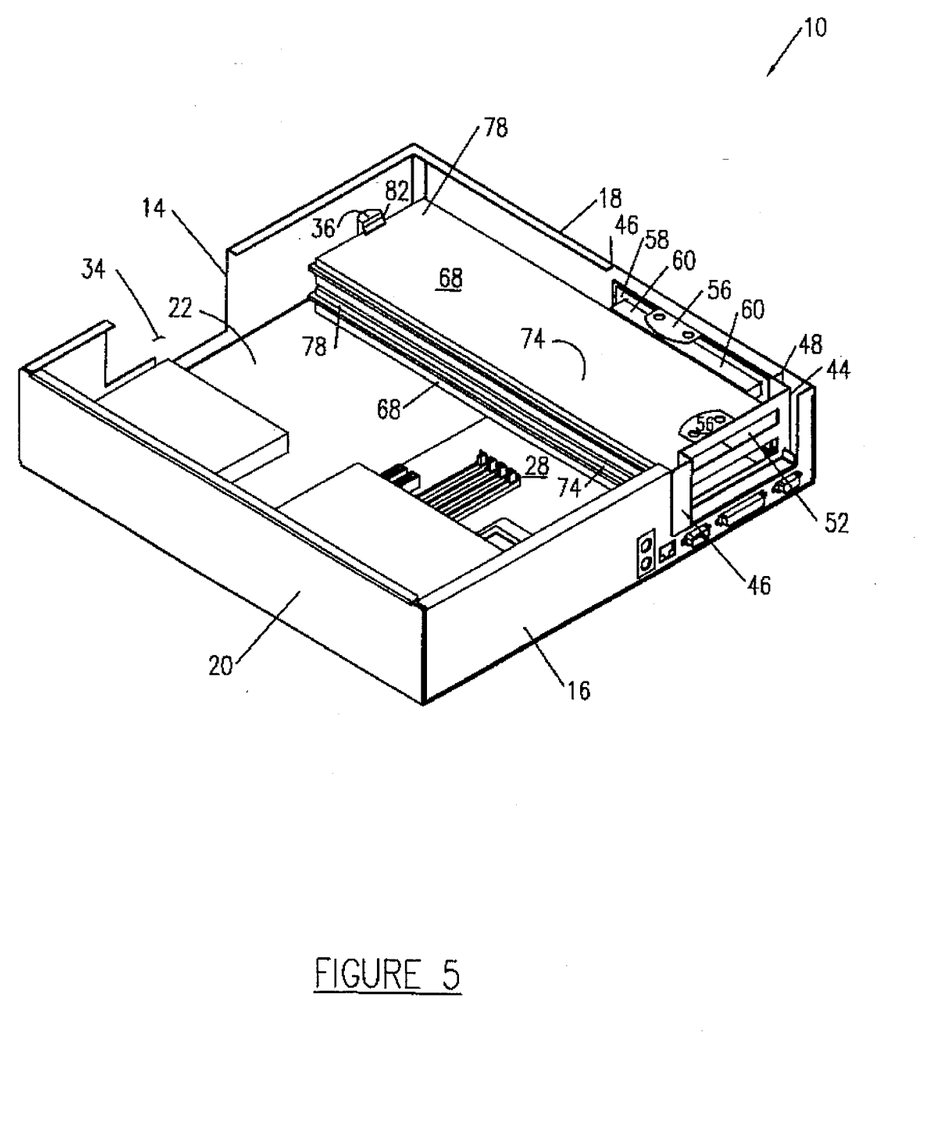
FIG. 5 illustrates a right rearside isometric view of the main chassis of FIG. 1, with the expansion card cage and first and second expansion cards of FIG. 3 inserted therein to illustrate cooperation between the guide body and the first and second expansion cards.

Turning now to FIG. 5, illustrated is a right rearside isometric view of the main chassis 10 of FIG. 1, with the expansion card cage 12 and first and second expansion cards 70,72 of FIG. 3 inserted therein to illustrate cooperation between the card guide structure 36 and the first and second expansion cards 70,72. In this view, the expansion card cage 12 is properly secured to and within the interior of the main chassis 10, and the first and second expansion cards 70,72 are also properly positioned with the expansion card cage 12. The first end portions 74 are received by the card connection sockets 60, and the second end portions 78 are received by the card guide structure 36.

Figure 6:
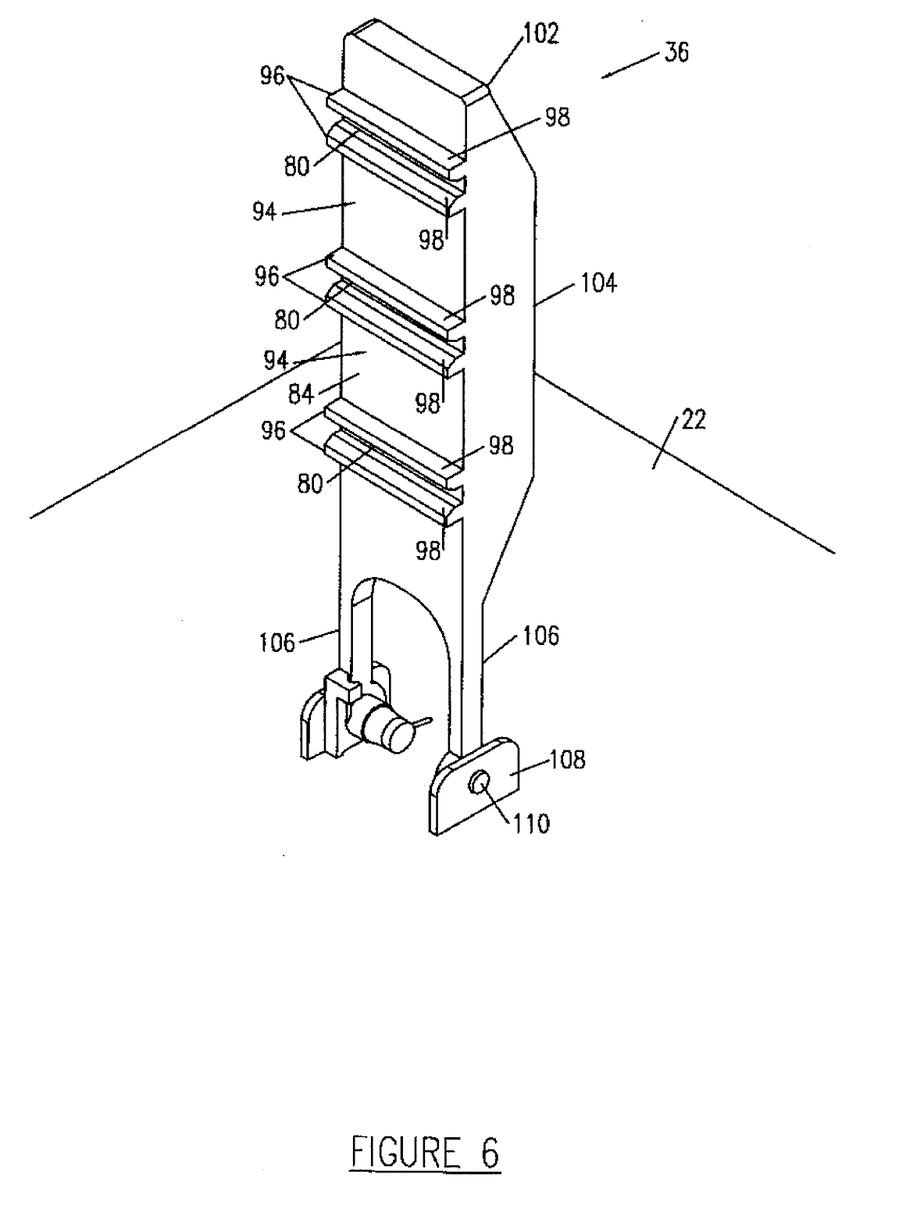
FIG. 6 illustrates a rear isometric perspective view of the guide body of the present invention movably attached to a wall of they n chassis of a PC.

Turning now to FIG. 6, there is illustrated an enlarged rear isometric perspective view of the card guide structure 36 of the present invention movably attached to a wall of the main chassis of a PC. As shown, the card guide structure 36 is a generally rectangular, planar body 94 that extends vertically in an unbiased position from the base wall 22 of the main chassis 10. The inner planar face 84 of planar body 94 has a plurality of the card guide structure projections 82 formed thereon that preferably form card guide projection-pairs 96. Preferably, the card guide structure projection-pairs 96 have slanted surfaces 98 thereon that are adapted to urge the card guide structure 36 toward a retracted position when the expansion card (not shown) bears against the slanted surfaces 98. The plurality of card guide projection-pairs 96 can support a plurality of horizontally stacked, parallel expansion cards. Preferably, the card guide projection-pairs 96 are spaced to allow approximately 1 inch of clearance between the expansion cards, thus facilitating air flow therebetween.

Recesses 80 are formed between the card guide structure projection-pairs 96 and have a width sufficient to receive an edge of an expansion card therein. The planar body 94 also has an opposing outer planar face 102 having elongated ribs 104 formed along the length of the planar body 94 and on opposite sides of the outer planar face 102. The purpose of these opposing ribs 104 is to strengthen the card guide structure 36.

The planar body 94 is supported from the base wall 22 by support members 106. In a preferred embodiment, the support members 106 are pivotally secured to vertically extending planar anchoring members 108 by pins 110 that project outwardly from the support members 106. The anchoring members 108 are preferably secured to the base wall 22 a distance from the expansion card cage sufficient such that the card guide structure 36 accommodates the length of the expansion cards. Alternatively however, the anchoring members 108 may be slidably engaged in a conventional track mechanism (not shown) that is secured to and extends along the base wall 22. In such embodiments, the track mechanism has the same position and direction with respect to the base wall 22 as the expansion cards such that the card guide structure 36 my be adjusted to accommodate varying lengths of the expansion cards.

Figure 7:
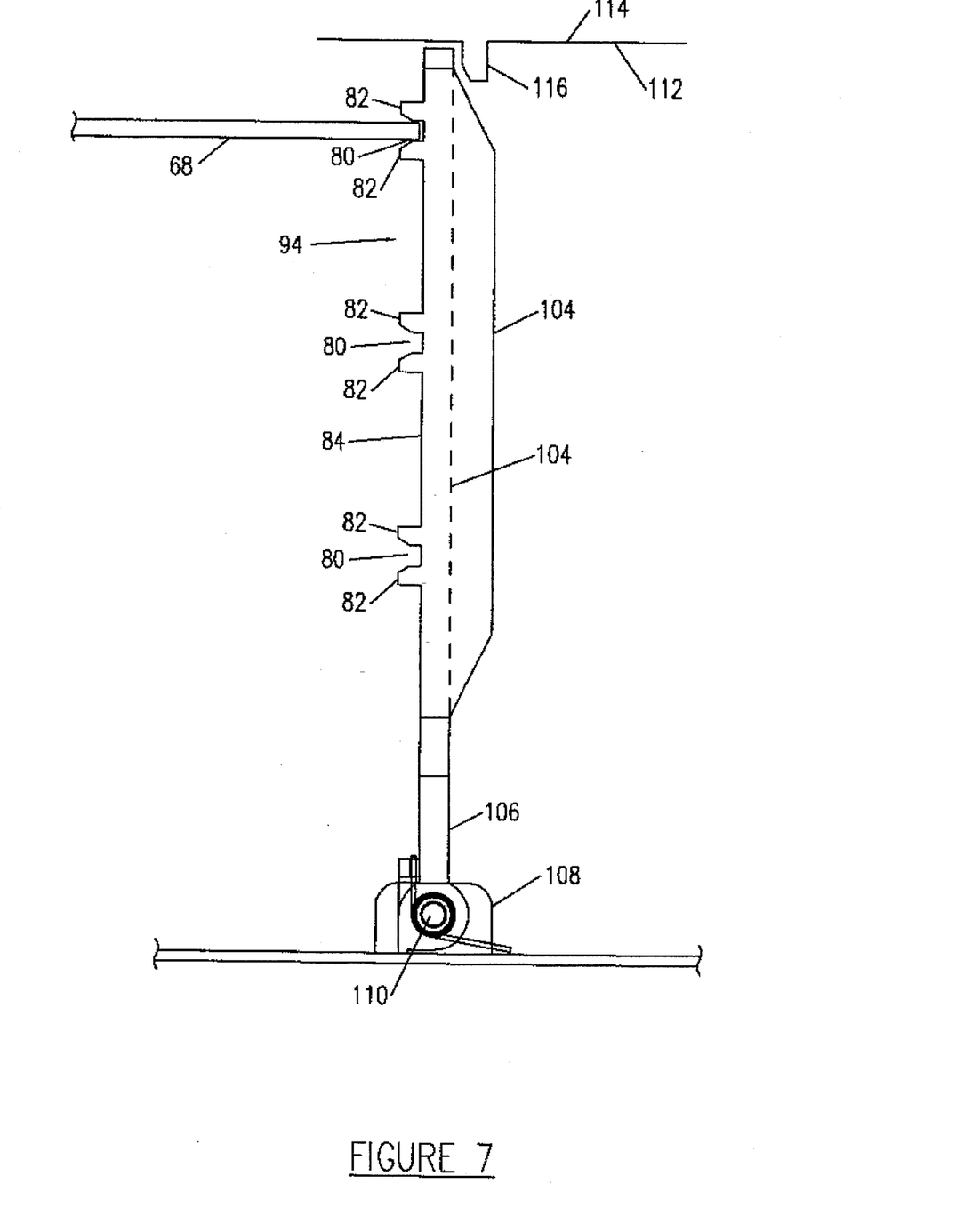
FIG. 7 illustrates a side view of the guide body of the present invention having an expansion card received therein.

Turning now briefly to FIG. 7, there is illustrated a side view of the card guide structure 36 of the present invention having an expansion card 68 received in one of a plurality of the recesses 84 formed between the card guide structure projection-pairs 96. One of the strengthening ribs 104 that is positioned on a side of the outer planar face 102 is clearly shown as well. Also illustrated is the inner surface 112 of the cover member 114 with a stop 116 thereon. The stop 116 prevents the card guide structure 36 from biasing in a direction away from the expansion card 68 to thereby prevent the expansion card 68 from being disengaged from the card guide structure 36.

Figure 8:
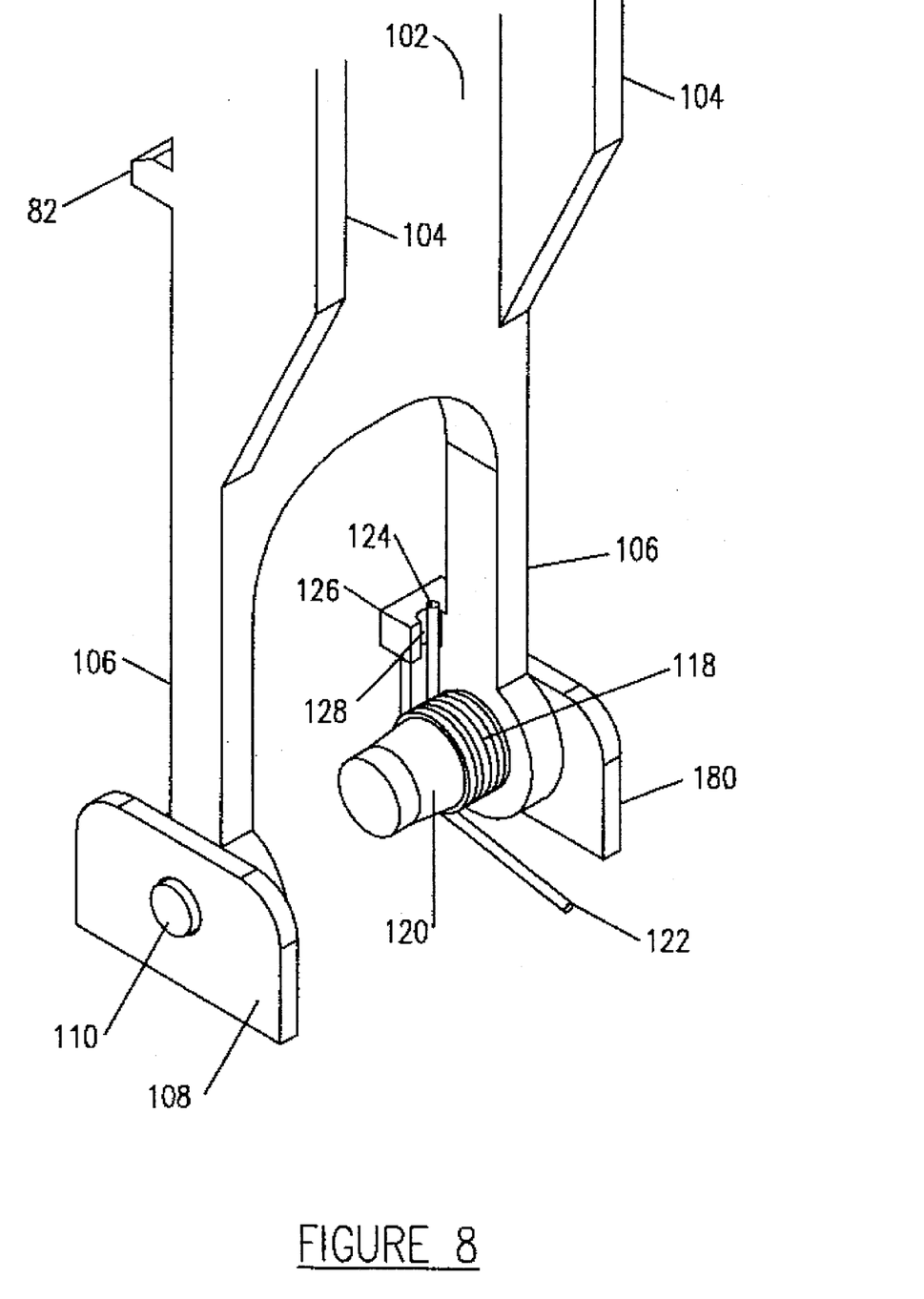
FIG. 8 illustrates a front isometric perspective view of a lower portion of the guide body of the present invention with a spring urging the guide body toward an engaged position.

Turning now to FIG. 8, there is illustrated a front isometric perspective view of the lower portion of the card guide structure 36 of the present invention with a spring 118 urging the card guide structure 36 toward a vertical position within the main chassis 10. The spring 118 is preferably a coiled spring that is coiled around a cylinder portion 120 that projects- transversely and outwardly from one of the support members 106 of the card guide structure 36. A first end 122 of the spring 118 is preferably biased against the base wall 22 of the main chassis 10 and a second end 124 of the spring 118 is biased against a biasing support tab 126 that extends outwardly from the support member 106 in the same direction as the cylinder portion 120. Preferably, the second end 124 of the spring 118 is received in a notch 128 that is formed in the biasing support tab 126.

The flexible card guide solves the problem of having a shortened card cage with disassociated card guides. It also eliminates the complications of having a riser card towards the outside wall of a system with the expansion cards pointing in toward the center of the system.

FIG. 1 shows one embodiment of a flexible card guide. There is a molded plastic member that provides the actual card guides for the expansion cards. It has ribs behind the card guides to stiffen the part. Also, two hinge pins are located on flexible arms which allow it to be snapped into holding features in the chassis. FIG. 2 details an additional pin on the inside of one of the arms that holds a torsional spring capable of overcoming the weight of the plastic member. The core of the spring is forced over a retaining feature molded around the circumference of the pin when it is assembled. Additionally, a molded feature retains one of the spring's legs and torques the spring when the plastic member is rotated. Finally, the plastic member is molded such that it can rotate only in one direction and will return to a vertical position if released. FIG. 3 shows this detail.

The flexible card guide solves the problem discussed above as follows. To allow for a shorter card cage in which the card guide is not integral, the flexible card guide moves freely and allows full length cards to push it out of the way while the card cage is installed or removed. The card guides themselves are shaped such that this motion will occur without requiring the user to interact with the plastic member. The shape of the card guides convert the force from the motion of the cards passing over the guides into a force that will cause the plastic member to rotate out of the way. Finally, a "stop" is designed into the system cover so that when the cover is installed the flexible card guide will not rotate and allow the cards to move freely. The stiffening ribs insure that the plastic member will not flex enough to free the cards when it is fixed at the top and bottom. These concepts are demonstrated in FIG. 4.

From the above description, it is apparent that the present invention provides, in a computer chassis containing a substantially planar removable expansion card therein, the computer chassis having an opening therein allowing access to the expansion card, a plane of the expansion card substantially parallel with a plane of the opening, a support structure for the expansion card and a method of supporting the expansion card. The support structure comprises: (1) a guide body movably attached to the computer chassis adapted to assume an engaged position and a retracted position and (2) guide projections on a surface of the guide body, a recess between the guide projections adapted to receive an edge of the expansion card when the guide body assumes the engaged position, the guide projections thereby supporting the expansion card as against a force normal to the plane of the expansion card, the guide body assuming the retracted position to allow the expansion card to be removed from the computer chassis in a direction normal to the plane of the expansion card and transverse to an orientation of the guide projections.

Although the present invention and its advantages have been described in detail, those skilled in the art should understand that they can make various changes, substitutions and alterations herein without departing from the spirit and scope of the invention in its broadest form.

What is claimed is:

1. In a computer chassis containing a substantially planar removable expansion card therein, said computer chassis having an opening therein allowing access to said expansion card, a plane of said expansion card substantially parallel with a plane of said opening, a support structure for said expansion card, comprising:

a guide body movably attached to said computer chassis adapted to assume an engaged position and a retracted position; and guide projections on a surface of said guide body, a recess between said guide projections adapted to receive an edge of said expansion card when said guide body assumes said engaged position, said guide projections thereby supporting said expansion card as against a force normal to said plane of said expansion card, said guide body assuming said retracted position to allow said expansion card to be removed from said computer chassis in a direction normal to said plane of said expansion card and transverse to an orientation of said guide projections.

2. The support structure as recited in claim 1 wherein said guide body is hingedly mounted to said computer chassis to allow said guide body to rotate between said engaged and retracted positions.

3. The support structure as recited in claim 1 further comprising a spring for urging said guide body toward said engaged position.

4. The support structure as recited in claim 1 wherein said computer chassis further comprises a chassis cover adapted to cover said opening and thereby enclose said expansion card within said computer chassis, said chassis cover including a stop thereon for preventing said guide body from assuming said retracted position when said chassis cover covers said opening.

5. The support structure as recited in claim 1 wherein one of said guide projections has a slanted surface thereon adapted to urge said guide body toward said retracted position when said expansion card bears against said slanted surface.

6. The support structure as recited in claim 1 wherein said computer chassis contains a expansion card cage, said expansion card cage providing a framework for supporting said expansion card and a riser card coupled to said expansion card, a plane of said riser card perpendicular to said plane of said expansion card, said riser card decoupling from a motherboard within said computer chassis as said expansion card is removed therefrom.

7. The support structure as recited in claim 1 wherein said guide body is movably attached to a wall of said computer chassis opposite said opening.

8. The support structure as recited in claim 1 further comprising a plurality of guide projection-pairs, said plurality of guide projection pairs adapted to support a plurality of parallel expansion cards within said computer chassis.

9. The support structure as recited in claim 1 wherein said guide body is elongated and provided with stiffening ribs substantially to prevent said guide body from flexing.

10. The support structure as recited in claim 1 wherein said computer chassis is a main chassis of a personal computer (PC).

11. In a computer chassis containing a substantially planar removable expansion card therein, said computer chassis having an opening therein allowing access to said expansion card, a plane of said expansion card substantially parallel with a plane of said opening, a method of supporting said expansion card, comprising the steps of:

moving a guide body movably attached to said computer chassis to an engaged position from a retracted position; and receiving an edge of said expansion card into a recess between guide projections on a surface of said guide body, said guide projections thereby supporting said expansion card as against a force normal to said plane of said expansion card, said guide body adapted to assume said retracted position to allow said expansion card to be removed from said computer chassis in a direction normal to said plane of said expansion card and transverse to an orientation of said guide projections.

12. The method as recited in claim 11 wherein said step of moving comprises the step of rotating said guide body to said engaged position from said retracted position.

13. The method as recited in claim 11 further comprising the step of urging said guide body toward said engaged position.

14. The method as recited in claim 11 further comprising the steps of:

covering said opening with a chassis cover, said chassis cover thereby enclosing said expansion card within said computer chassis; and preventing said guide body from assuming said retracted position when said chassis cover covers said opening with a stop on said chassis cover.

15. The method as recited in claim 11 further comprising the step of urging said guide body toward said retracted position when said expansion card bears against a slanted surface on one of said guide projections.

16. The method as recited in claim 11 wherein said computer chassis contains a expansion card cage, said expansion card cage providing a framework for supporting said expansion card and a riser card coupled to said expansion card, a plane of said riser card perpendicular to said plane of said expansion card, said method further comprising the step of decoupling said riser card from a motherboard within said computer chassis as said expansion card is removed therefrom.

17. The method as recited in claim 11 wherein said guide body is movably attached to a wall of said computer chassis opposite said opening.

18. The method as recited in claim 11 further comprising a plurality of guide projection-pairs, said plurality of guide projection pairs adapted to support a plurality of parallel expansion cards within said computer chassis.

19. The method as recited in claim 11 wherein said guide body is elongated, said method further comprising the step of substantially preventing said guide body from flexing with stiffening ribs provided on said guide body.

20. The method as recited in claim 11 wherein said computer chassis is a main chassis of a personal computer (PC).

21. A personal computer chassis, comprising:

a main chassis having a base wall and front, rear and opposing side walls joined to said base wall and a top open portion;

an expansion card cage removably secured to one of said opposing side walls adjacent said rear wall, said expansion card cage having a framework configured to receive a riser card therein, said riser card having a card edge connector configured to be removably received in a motherboard riser connector to thereby electrically couple said riser card to a motherboard positioned with said main chassis, said riser card further having an expansion card connection socket for removably receiving therein an expansion card to thereby electrically couple said expansion card to said motherboard, said expansion card substantially parallel with a plane of said top open portion;

a card guide structure pivotally mounted to said base wall and biased between an engaged position and a retracted position; and card guide projections on a surface of said card guide structure having a recess formed between said card guide projections adapted to receive an edge of said expansion card when said card guide structure is in said engaged position, said card guide projections thereby supporting said expansion card as against a force normal to said plane of said expansion card, said card guide structure movable to said retracted position to allow said expansion card to be removed from said computer chassis in a direction normal to said plane of said expansion card and transverse to an orientation of said card guide projections.

22. The support structure as recited in claim 21 further comprising a spring for biasing said guide body toward said engaged position.

23. The support structure as recited in claim 21 wherein said computer chassis further comprises a chassis cover adapted to cover said top open portion and thereby enclose said expansion card within said computer chassis, said chassis cover including a stop thereon for preventing said guide body from moving to said retracted position when said chassis cover covers said top open portion.

24. The support structure as recited in claim 21 wherein one of said card guide projections has a slanted surface thereon adapted to urge said card guide structure toward said retracted position when said expansion card bears against said slanted surface.

25. The support structure as recited in claim 21 wherein said card guide structure is movably attached to said base wall of said computer chassis.

26. The support structure as recited in claim 21 further comprising a plurality of guide projection-pairs, said plurality of guide projection pairs adapted to support a plurality of parallel expansion cards within said computer chassis.

27. The support structure as recited in claim 21 wherein said card guide structure is elongated and provided with stiffening ribs substantially to prevent said card guide structure from flexing.

\* \* \* \* \*